United States Patent [19]
Ueda et al.

[11] Patent Number: 5,284,615
[45] Date of Patent: Feb. 8, 1994

[54] METHOD FOR MAKING INJECTION MOLDED SOFT MAGNETIC MATERIAL

[75] Inventors: Koshiro Ueda; Mutsumi Moribayashi; Tohru Kohno, all of Omiya, Japan

[73] Assignee: Mitsubishi Materials Corporation, Tokyo, Japan

[21] Appl. No.: 914,854

[22] Filed: Jul. 15, 1992

[30] Foreign Application Priority Data

Jul. 15, 1991 [JP] Japan ................... 3-200112

[51] Int. Cl.$^5$ .............................................. B22F 3/16
[52] U.S. Cl. ....................................... 419/37; 419/30; 419/31; 419/32; 419/33; 419/36; 419/38; 419/39; 419/40; 419/44; 419/23; 75/235; 75/243
[58] Field of Search ............ 419/25, 36, 37, 53, 419/54, 57, 60, 65, 30, 31, 32, 33, 38, 39, 40, 44

[56] References Cited

U.S. PATENT DOCUMENTS

| | | | |
|---|---|---|---|
| 4,964,907 | 10/1990 | Kiyota et al. | 75/235 |
| 5,002,728 | 3/1991 | Achikita et al. | 419/23 |
| 5,032,355 | 7/1991 | Achikita et al. | 419/23 |
| 5,055,128 | 10/1991 | Kiyota et al. | 75/246 |
| 5,067,979 | 11/1991 | Kiyota et al. | 75/243 |
| 5,098,648 | 3/1992 | Kiyota et al. | 419/23 |

FOREIGN PATENT DOCUMENTS

| | | | |
|---|---|---|---|
| 0324122 | 7/1989 | European Pat. Off. | B22F 3/22 |
| 0379583 | 8/1990 | European Pat. Off. | C22C 1/04 |

*Primary Examiner*—Donald P. Walsh
*Assistant Examiner*—John Greaves
*Attorney, Agent, or Firm*—Scully, Scott, Murphy & Presser

[57] ABSTRACT

The present invention presents a method of processing ferrous powder materials to produce small component parts exhibiting excellent soft magnetic properties, in particular, residual magnetic flux density. The processing steps involve, in part, mixing with a binder, dewaxing or presintering at a temperature higher than in the conventional dewaxing process, followed by final sintering and a further conversion sintering, at a temperature lower than in the conventional sintering process, to produce parts having density values of over 96% theoretical density and excellent soft magnetic properties. The invented method is suitable for producing small component parts having sufficient strength and excellent soft magnetic properties to make them suitable for miniaturized electrical and electronic equipment.

1 Claim, No Drawings

METHOD FOR MAKING INJECTION MOLDED SOFT MAGNETIC MATERIAL

BACKGROUND OF THE INVENTION

This invention relates to a processing method of making injection molded ferrous component parts having excellent soft magnetic properties, by a two stage sintering processing. The invented processing method is particularly suitable for making small component parts for miniaturized electrical and electronic equipment.

Injection molding of ferrous powders is a known art. For components such as yokes, for example, parts having soft magnetic properties are required. Such parts are known to be made from pure iron particles of 50-100 μm average diameter, which are pressed at 5-7 tons/cm$^2$ to produce green compacts. The green compacts are sintered in a hydrogen or dissociated ammonia atmosphere at temperatures of 1100°-1400° C.

The recent trends toward energy efficiency and light weight have prompted miniaturization of components and equipment in industries, and the demands for small thin-walled structural components have increased. But the conventional processing method was able to achieve only about 85-95% theoretical density, and the resulting parts made by the process lacked the proper soft magnetic properties, in particular, the residual magnetic flux density was low and such parts were unable to satisfy the product requirements for soft magnetic applications.

The present invention resulted from extensive studies by the inventors to solve such problems of low residual flux density and other problems associated with the conventional processing methods. The inventors found that a new processing method which combined selected steps of the conventional method with the newly discovered steps produced the best results.

For example, carbonyl iron powders of less than 15 μm average particle diameter are mixed with 8-15 weight % of a thermoplastic resin binder. The mixture is kneaded in a kneader at 135° C. for three hours, and the mixture is then cooled to room temperature. This step is followed by a further granulation step in the kneader to obtain a feed particles mix containing particles of about 1-5 mm diameters.

The feed particles at temperatures of 130°-140° C. are injection molded into molded parts at an injection pressure of 500-700 kgf/cm$^2$ and at an injection cycle time of 20-40 seconds.

The molded parts are subjected to dewaxing, i.e. presintering, to reduce the carbon content in the molded parts, produced by the decomposing binder, to less than 0.05 weight % by heating the molded parts at relatively high temperatures in the range of 680°-750° C. The parts are further sintered at relatively low temperatures in the range of 870°-910° C., to obtain molded parts having density values of over 96% theoretical density.

The above process is followed by a further heating step of conversion sintering treatment, involving heating the sintered parts at 1050°-1350° C. in a reducing atmosphere or in a vacuum to produce molded parts having excellent soft magnetic properties, in particular, high residual magnetic flux density required for component parts.

SUMMARY OF THE INVENTION

The present invention is based on the results of study as presented above, and the processing method to produce injection molded parts having excellent soft magnetic properties, in particular high residual magnetic flux density and maximum permeability, comprises the following steps:

(a) Pure iron powder is hot mixed with 8-15 weight % of a thermoplastic binder, and after cooling the mixture to room temperature, the mixture is subjected to a granulation step, and the powdered particles are formed into molded parts by injection molding;

(b) the molded parts are dewaxed at a temperature between 680°-750° C. until the carbon content is less than 0.05 weight %;

(c) the parts are then sintered at a relatively low temperature between 870°-910° C., thereby obtaining high density molded iron parts; and (d) an additional conversion sintering step of heating the sintered parts from step (c) at a temperature between 1050°-1350° C., thereby obtaining sintered parts having high residual magnetic flux density and maximum permeability.

The reasons for choosing the range of various operating parameters are outlined below.

(1) Binder Proportion

When the proportion of the binder is less than 8 weight %, it becomes difficult to perform injection molding, and when this value exceeds 15 weight %, it becomes difficult to produce parts having a value of theoretical density higher than 96%, and the necessary strength and the desired soft magnetic properties are not achieved. For such reasons, the proportion of the binder was chosen to be between 8-15%.

(2) Dewaxing Temperature

When the dewaxing temperature is less than 680° C., presintering is insufficient, and not only the shape retention becomes difficult, but the necessary dewaxing period is prolonged. On the other hand, when the temperature exceeds 750° C., it is not possible to obtain theoretical density of over 96%. For such reasons, dewaxing temperature was chosen to be between 680°-750° C.

(3) Carbon Content of the Presintered Part

The theoretical density of the parts becomes higher as the carbon content therein is decreased. When the carbon content exceeds 0.05 weight %, the density value becomes less than 96% theoretical density, and it is not possible to attain high residual magnetic flux in soft magnetic parts. For such reasons, the carbon content was chosen to be less than 0.05 weight %.

(4) Sintering Temperature

When the sintering temperature is less than 870° C., not only the degree of particle binding in the sintered part is insufficient, but also the sintered density is low. On the other hand, when the sintering temperature exceeds 910° C., the desired density cannot be obtained to produce the required soft magnetic properties. For these reason, the sintering temperature was chosen to be 870°-910° C.

(5) Soft Magnetic Conversion Sintering

To produce parts having the required high residual magnetic flux density, it is necessary to subject the parts to the soft magnetic conversion sintering step. When the conversion sintering process is carried out at less than 1050° C., the desired degree of residual magnetic flux cannot be obtained while when the temperature is higher than 1350 0C, the heat distortion of the parts becomes a problem. For such reasons, the temperature range of conversion processing was chosen to be between 1050°-1350° C.

PREFERRED EMBODIMENT

An embodiment of the invention is concerned with the application of the method to produce ferrous parts having excellent soft magnetic properties.

Ring-shaped test parts having the dimensions of 20 mm OD×10 mm ID×10 mm thickness were made by using carbonyl iron powders having the average particle diameters shown in Table 1. The iron powder was mixed with a thermoplastic binder consisting primarily of an ethylene-vinyl acetate copolymer and paraffin wax in the proportion shown in Table 1. The mixtures were hot mixed in a kneader for 3 hours at 135° C., subjected to a granulation treatment in the kneader at room temperature to obtain feed particles having a particle distribution primarily in the range of 1-5 mm. The feed particles were molded into test parts by using a regular injection molding machine to produce test parts measuring 30 mm×40 mm×1.5 mm thickness at a pressure of 600 kgf/cm$^2$, feed particle temperature of 140° C., injection cycle timing of 30 seconds/cycle. Dewaxing treatment, i.e. presintering, was carried out as shown in Table 1 to produce dewaxed test parts (i.e. presintered parts), having carbon and theoretical density values as shown in Table 1. The presintered parts were subjected to the final sintering treatment to produce test parts for embodiment examples 1-5 of the embodiment and for comparative examples 6-10 for comparison purposes. The molded parts were subjected to dewaxing steps, i.e. presintering, under the conditions shown in Table 1 to produce presintered test parts containing carbon and density values shown in Table 2. The presintered parts were subjected to an additional sintering step of conversion sintering to impart soft magnetic properties to the parts, whose treatment conditions are shown in Table 2 for each of the examples 1-9 of the embodiment.

For comparative evaluation purposes, a gas atomized iron powder having an average particle diameter of 80 μm was pressed at 6 tons/cm$^2$ to produce plate shaped test parts measuring 30 mm×40 mm×1.5 mm thickness. The pressed parts were sintered in a hydrogen atmosphere at 1300° C. for one hour to produce parts having soft magnetic properties. The values of theoretical density for the test parts are shown in Table 2, along with the test results for residual magnetic flux density, maximum permeability and coercive force.

The results shown in Tables 1 and 2 demonstrate clearly that the parts processed by the invented method represented by examples 1-9 are superior to the iron parts processed by the conventional method in terms of the density, residual magnetic flux density and maximum permeability properties.

Therefore, it has been demonstrated that the invented method produces injection molded parts having high residual magnetic flux density, thereby contributing greatly to the production technology for thin-walled components parts to enable manufacturing of energy-efficient and light weight and miniature component parts for use in various electrical and electronic equipment.

TABLE 1

| Ex No. | Composition | | | Dewaxing | | | Presinter | | Sintering | | |
|---|---|---|---|---|---|---|---|---|---|---|---|
| | Av D (μm) | Fe (w/o) | Binder (w/o) | Atm | Temp (°C.) | Holding T (hours) | Den (%) | Carbon (w/o) | Atm | Temp (°C.) | Holding T (hours) |
| 1 | 4 | 88 | 12 | H$_2$ | 720 | 2 | 65 | 0.028 | H$_2$ | 900 | 5 |
| 2 | 7 | 91 | 9 | H$_2$ | 700 | 3 | 63 | 0.010 | H$_2$ + Ar | 900 | 4 |
| 3 | 11 | 85 | 15 | H$_2$ | 690 | 4 | 61 | 0.009 | H$_2$ + N$_2$ | 900 | 3 |
| 4 | 7 | 92 | 8 | H$_2$ + Ar | 680 | 5 | 60 | 0.047 | H$_2$ | 900 | 5 |
| 5 | 7 | 92 | 8 | H$_2$ + N$_2$ | 750 | 1 | 66 | 0.006 | H$_2$ | 900 | 5 |
| 6 | 15 | 86 | 14 | H$_2$ | 750 | 3 | 63 | 0.008 | H$_2$ | 870 | 1 |
| 7 | 4 | 92 | 8 | H$_2$ + N$_2$ | 700 | 3 | 64 | 0.020 | H$_2$ | 910 | 5 |
| 8 | 8 | 92 | 8 | H$_2$ | 700 | 5 | 63 | 0.009 | H$_2$ | 900 | 5 |
| 9 | 8 | 92 | 8 | H$_2$ + Ar | 700 | 5 | 62 | 0.010 | H$_2$ + N$_2$ | 900 | 5 |

Notes regarding Table 1:
Av D - Average diameter;
H$_2$ + N$_2$ - dissociated ammonia;
Ex - Example;
Den - Density;
H$_2$ + Ar - H$_2$ plus 10% Argon;
Atm - atmosphere

TABLE 2

| Example No. | Density (%) | Conversion Sintering | | | Res Flux Density (KG) | Max Permeab | Coercive Force (Oe) |
|---|---|---|---|---|---|---|---|
| | | Atm | Temp (°C.) | Holding Time (hrs) | | | |
| 1 | 99 | H$_2$ | 1200 | 3 | 13.7 | 3200 | 2.2 |
| 2 | 98 | H$_2$ | 1200 | 1 | 13.5 | 3000 | 2.2 |
| 3 | 96 | H$_2$ | 1200 | 2 | 12.9 | 2700 | 2.2 |
| 4 | 97 | H$_2$ | 1200 | 2 | 13.1 | 2900 | 2.2 |
| 5 | 98 | Vac | 1200 | 1 | 13.4 | 3000 | 2.2 |
| 6 | 96 | Vac | 1200 | 2 | 12.8 | 2800 | 2.3 |
| 7 | 99 | Vac | 1200 | 3 | 13.6 | 3200 | 2.2 |
| 8 | 98 | H$_2$ | 1100 | 3 | 13.4 | 2900 | 2.3 |
| 9 | 98 | H$_2$ | 1300 | 1 | 13.5 | 3000 | 2.2 |

TABLE 2-continued

| Example No. | Density (%) | Conversion Sintering | | | Res Flux Density (KG) | Max Permeab | Coercive Force (Oe) |
| --- | --- | --- | --- | --- | --- | --- | --- |
| | | Atm | Temp (°C.) | Holding Time (hrs) | | | |
| Conv | 92 | — | — | — | 10.0 | 1800 | 2.3 |

Notes:
Atm - Atmosphere;
Conv - Conventional

What is claimed is:

1. A method for making injection molded component parts having properties suitable for soft magnetic applications in small electrical and electronic equipment, said method comprising the steps of:

(a) hot mixing a ferrous powder with a thermoplastic binder at a concentration between 8-15 weight % to product a powder mix;

(b) cooling said powder mix to room temperature and subjecting said powder mix to a granulation process to produce a feed particle mix for injection molding;

(c) injection molding said feed particle mix to produce molded parts;

(d) dewaxing said molded parts of step (c) at a temperature between 680°-750° C. to produce presintered parts containing not more than 0.05 weight % carbon produced from said binder;

(e) subjecting said presintered component parts of step (d) to final sintering at a temperature of between 870°-910° C.; and (f) subjecting said component parts of step (e) to a conversion sintering step at a temperature of 1050°-1350° C. to impart soft magnetic properties to said component part;

thereby producing injected molded parts having soft magnetic properties.

* * * * *

UNITED STATES PATENT AND TRADEMARK OFFICE
CERTIFICATE OF CORRECTION

PATENT NO.  : 5,284,615
DATED       : February 8, 1994
INVENTOR(S) : Koshiro Ueda, et al.

It is certified that error appears in the above-indentified patent and that said Letters Patent is hereby corrected as shown below:

Column 3, line 5: "1350 0C" should read --1350°C--

Column 3, line 55: delete "duce test parts for embodiment examples 1-5 of the" and Column 4, line 1 insert the following: --duce test parts for embodiment examples 1-5 of the--

Signed and Sealed this

Sixteenth Day of August, 1994

Attest:

BRUCE LEHMAN

*Attesting Officer*    *Commissioner of Patents and Trademarks*